United States Patent [19]
Dalton et al.

[11] Patent Number: 5,116,718
[45] Date of Patent: May 26, 1992

[54] CONTACT PRINTING PROCESS

[75] Inventors: William F. Dalton; Henry B. Micks, Jr., both of Richmond, Va.

[73] Assignee: AT&T Bell Laboratories, Murray Hill, N.J.

[21] Appl. No.: 715,849

[22] Filed: Jun. 14, 1991

Related U.S. Application Data

[63] Continuation of Ser. No. 414,035, Sep. 28, 1989, abandoned.

[51] Int. Cl.5 ................................................ G03C 5/56
[52] U.S. Cl. ..................................... 430/327; 355/53; 355/92; 430/311; 430/396
[58] Field of Search ...................... 430/327; 355/92, 53

[56] References Cited

U.S. PATENT DOCUMENTS

| | | | |
|---|---|---|---|
| 4,060,235 | 11/1977 | Weikel, Jr. | 271/174 |
| 4,226,526 | 10/1980 | Spence-Bate et al. | 355/53 |
| 4,262,594 | 4/1981 | Landsman | 101/382 MV |
| 4,504,142 | 3/1985 | Richards | 355/92 |
| 4,810,621 | 3/1989 | Akkapeddi et al. | 430/321 |
| 4,903,631 | 2/1990 | Morris | 228/33 |
| 4,927,733 | 5/1990 | Stout | 430/256 |

Primary Examiner—Richard L. Schilling
Assistant Examiner—Thorl Chea
Attorney, Agent, or Firm—L. H. Birnbaum

[57] ABSTRACT

Disclosed is a method for increasing the resolution in contact printing operations by ensuring an intimate contact between the mask and photoresist. A flow of air is directed at the underside of the workpiece being printed while the mask is in place to provide pressure for the necessary contact.

7 Claims, 1 Drawing Sheet

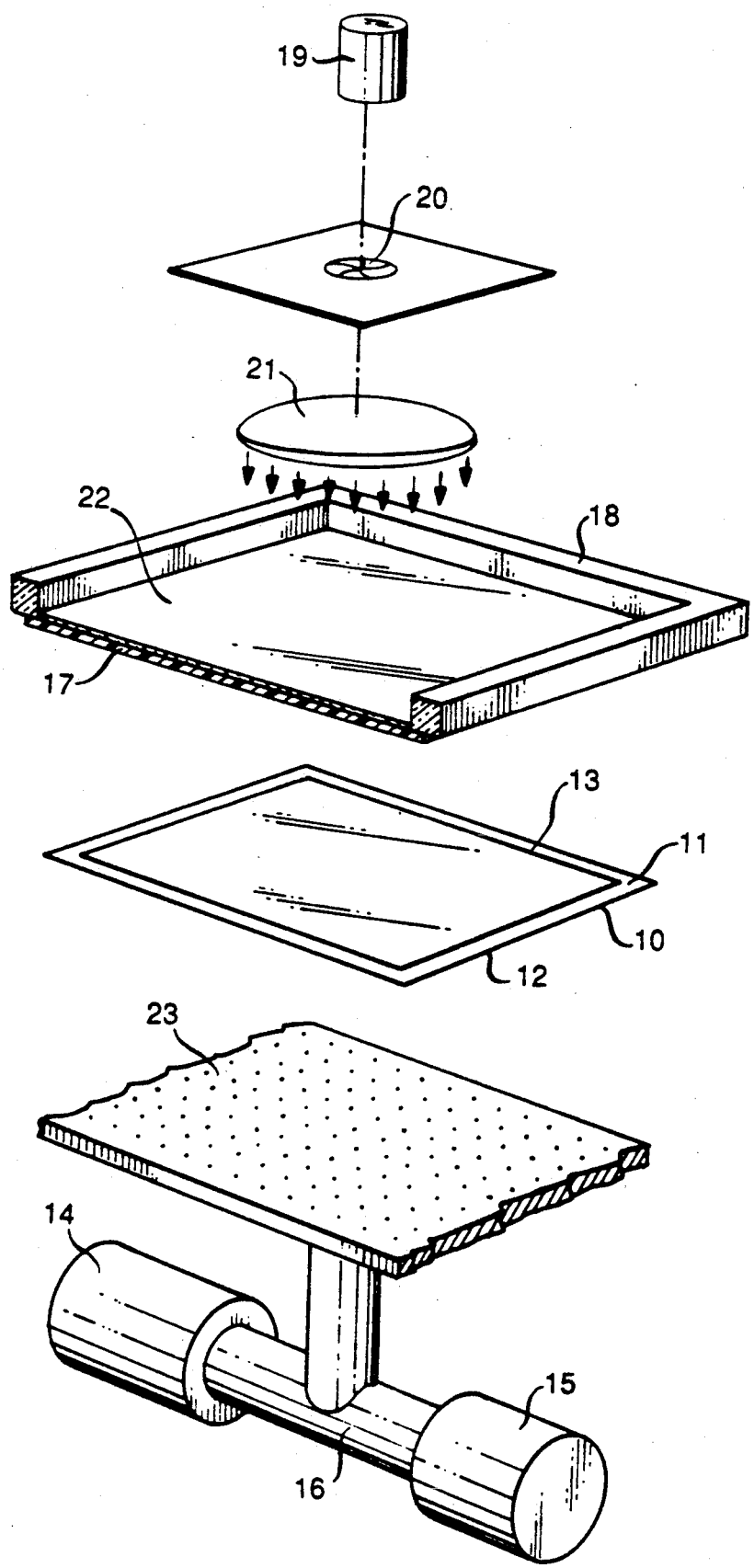

CONTACT PRINTING PROCESS

This application is a continuation of application Ser. No. 07/414,035, filed on Sept. 28, 1989, now abandoned.

BACKGROUND OF THE INVENTION

This invention relates to a contact printing process.

The fabrication of articles such as printed circuit boards has generally included a contact printing operation where a mask is placed in direct contact with a photoresist layer on the board, the structure is exposed to collimated light, and the photoresist is developed to produce an appropriate pattern for further processing. A typical prior art technique placed the article in an envelope which was then evacuated so that outside pressure would force the mask and photoresist into contact. This process can produce registration difficulties when mechanized alignment techniques are used. An alternative approach, which appears to be more compatible with mechanized alignment pins, is known as the "soft contact" method, and relies simply on the weight of the glass frame holding the mask to maintain contact between the mask and photoresist.

Unfortunately, masks develop surface abrasions, and the circuit boards are not consistently planar resulting in less than intimate contact with the mask. Both of these effects tend to blur developed features as a result of diffusion of the collimated light. Thus, it is difficult for the prior art techniques to achieve the resolution capability needed for increasingly finer lines called for in new generations of circuit boards (typically 50.8 to 76.2 microns line widths) at an acceptable yield.

It is, therefore, an object of the invention to improve the resolution capability and yield of a contact printing operation.

SUMMARY OF THE INVENTION

This and other objects are achieved in accordance with the invention, which is a method of defining a pattern in a photoresist layer formed over a first major surface of a substrate. A mask is placed in contact with the photoresist layer. A flow of gas is then applied to a second major surface of the substrate opposite to said first surface. While the gas flow is applied, the photoresist layer is exposed to a source of light through the mask.

BRIEF DESCRIPTION OF THE DRAWING

These and other features of the invention are delineated in detail in the following description. In the drawing, the FIGURE is an exploded schematic view of apparatus which may be used to practice the invention in accordance with one embodiment.

It will be appreciated that, for purposes of illustration, this figure is not necessarily drawn to scale.

DETAILED DESCRIPTION

A highly schematic version of a contact printing station useful for the invention is shown in the FIGURE for illustrative purposes. A printed circuit board panel 10, typically made of epoxy glass, has two major surfaces, 11 and 12. On at least one major surface (11) a photoresist layer, 13, is formed. For example, the photoresist can be a polymer film which is deposited by laminating to a thickness of approximately $50\mu$. The photoresist usually covers essentially the entire surface of the panel, which typically measures 45 cm × 61 cm. The panel is transported to the station on a cushion of air created by a transport manifold, a portion of which is shown as 23 in the figure. The air cushion is established by a pressure source, 14, such as a standard centrifugal blower which causes air flow through the manifold.

Once the panel, 10, is transported to the station, the panel is registered by alignment pins (not shown). The panel is held down by switching from the pressure source, 14, to a vacuum source, 15, utilizing a shuttle valve, 16. The vacuum source is typically a standard centrifugal vacuum fan which produces a vacuum of approximately 0.34 ATMS (10" Hg) to keep the surface, 12, of the panel on the transport manifold.

Once the panel is secured, a mask, 17, which includes the pattern to be produced is lowered onto the photoresist layer. The mask, which typically is a sheet of mylar approximately 0.20 mm thick, is held to a glass plate, 22, which is in turn mounted within a glass frame, 18, a portion of which is cut away for illustrative purposes. The plate is held to the frame, and the mask is held to the lower surface of the plate, by means of a vacuum channel (not shown) in the glass frame according to standard techniques. Thus, when the mask is lowered, the weight of the frame, which is typically approximately 20 kg, ensures contact between the mask and photoresist layer in accordance with typical "soft contact" techniques.

In accordance with a main feature of the invention, the shuttle valve, 16, is again switched to the pressure source, 14, so that a flow of air is now directed to the surface, 12, opposite to the surface (11) which includes the photoresist layer with the mask, 17, thereon. This air flow forces the panel, 10, against the mask, 17, to ensure more intimate contact between the mask and photoresist layer, 13, thereby providing a "pressure boost" to the printing process. The particular pressure generated was approximately $6.8 \times 10^{-3}$ ATM (0.1 psi). Pressures within the range $3.5 \times 10^{-3}$ to $9.5 \times 10^{-3}$ ATM (0.05-0.14 psi) would appear to be useful for a frame of 20 Kg. Pressures above this range could raise the panel and mask off the manifold excessively, while pressures below this range may not provide sufficient contact between the mask and photoresist. In general, it is desirable not to raise the entire frame and substrate off the manifold, although a portion may be raised to permit the escape of gas. Pressure should, therefore, be adjusted accordingly based on the weight of the frame.

While the air flow was directed to the underside of panel, 10, the photoresist layer, 13, was exposed to a source of ultraviolet light, 19, by opening a shutter, 20. The light was collimated by appropriate optics illustrated as lens, 21. Exposure was, typically, for a period of 10 seconds.

After exposure was completed, the shutter was closed and the valve, 16, again switched to the vacuum source, 15, so that the panel was held to the surface of the manifold, 13. The mask, 17, was then raised from the surface of the photoresist, and the manifold again switched to the pressure source, 14, to create an air cushion for the exit of the panel from the printing station. The panel was then developed by standard techniques at another station in order to create the mask pattern in the photoresist layer, 13.

It will be appreciated that the previously described process can be performed with existing commercially available apparatus, such as a machine sold by Tamarack Scientific under the designation 170DS-A Photoprinter.

Use of the pressure boost during the contact printing operation was found to improve the resolution of panels with line widths in the range 50.8 to 203.2 microns depending on the type of printer employed. The invention was particularly advantageous for generating line widths of 50.8 to 101.6 microns, where prior art processes generally generated low yields. In addition, the contact between the mask and photoresist is sufficiently intimate so that it may be possible to eliminate the need for collimation of the light, thereby reducing the cost of contact printing apparatus.

While the invention has been described with regard to the fabrication of printed circuit boards, it should be apparent that any substrate with a photoresist layer thereon could benefit from the principles described herein.

Various additional modifications will become apparent to those skilled in the art. All such variations which basically rely on the teachings through which the invention has advanced the art are properly considered within the scope of the invention.

We claim:

1. A method of defining a pattern in a photoresist layer formed over a first major surface of a substrate comprising the step of:

transporting the substrate to a station by means of a manifold;

applying a vacuum through said manifold to said substrate at said station to hold it in place;

placing a mask in contact with the photoresist layer;

applying a flow of gas through said manifold to a second major surface of the substrate opposite to said first surface; and while applying said gas flow, exposing the photoresist layer to a source of light through said mask.

2. The method according to claim 1 wherein the substrate comprises a printed circuit board material.

3. The method according to claim 2 wherein the pattern includes line widths in the range 50.8 to 203.2 microns.

4. The method according to claim 2 wherein the pattern includes line widths of 50.8 to 101.6 microns.

5. The method according to claim 1 wherein the pressure applied to the second major surface lies within the range $3.5 \times 10^{-3}$ to $9.5 \times 10^{-3}$ ATMS.

6. The method according to claim 1 wherein the source of light produces ultraviolet light.

7. The method according to claim 1 wherein the gas comprises air.

* * * * *